United States Patent
Yoshizawa

(10) Patent No.: US 7,868,626 B2
(45) Date of Patent: Jan. 11, 2011

(54) BURST NOISE CANCELING APPARATUS

(75) Inventor: Nobuhiro Yoshizawa, Tokyo (JP)

(73) Assignee: GE Medical Systems Global Technology Company, LLC, Waukesha, WI (US)

(*) Notice: Subject to any disclaimer, the term of this patent is extended or adjusted under 35 U.S.C. 154(b) by 1149 days.

(21) Appl. No.: 11/533,106

(22) Filed: Sep. 19, 2006

(65) Prior Publication Data

US 2007/0070245 A1 Mar. 29, 2007

(30) Foreign Application Priority Data

Sep. 27, 2005 (JP) ............................. 2005-278992

(51) Int. Cl.
  *G01R 29/26* (2006.01)
  *H04B 15/00* (2006.01)
(52) U.S. Cl. ...................................... 324/613; 702/191
(58) Field of Classification Search ................. 324/613; 702/191
See application file for complete search history.

(56) References Cited

U.S. PATENT DOCUMENTS

| | | | |
|---|---|---|---|
| 4,920,548 A | 4/1990 | Gaussa, Jr. et al. | |
| 6,327,689 B1 | 12/2001 | Tian | |
| 6,563,885 B1 | 5/2003 | Magee et al. | |
| 2002/0167434 A1* | 11/2002 | Miyano | 341/155 |
| 2005/0143109 A1* | 6/2005 | Ohashi | 455/501 |
| 2005/0228626 A1 | 10/2005 | Simelius | |

FOREIGN PATENT DOCUMENTS

JP 2003098193 4/2003

* cited by examiner

*Primary Examiner*—Amy He
(74) *Attorney, Agent, or Firm*—Armstrong Teasdale LLP

(57) ABSTRACT

The present invention provides a burst noise canceling apparatus which can remove burst noises even in a one-time data, without the need of a large amount of memory. The device according to the present invention incorporates an analog-to-digital converter for sampling a received MR signal to convert it to digital value to output it; a FIFO for delaying the digital value by delay time before output; a burst noise detection circuit for outputting a detection pulse upon detecting the presence of a burst noise in the received MR signal; a shift register having a first output which goes to "1" for the time corresponding to a pulse width of the detection pulse after elapsed time L−B since the detection pulse is read, and a second output which goes to "1" for the time corresponding to the pulse width of the detection pulse after elapsed time L+A since the detection pulse is read; an up-and-down counter which counts up at the rising edge of the first output and counts down at the falling edge of the second output; an OR circuit for outputting "1" when a count of the up-and-down counter is not "0" as a removal instruction signal; and a data removal processing unit which forces the output of the FIFO into "0" when the removal instruction signal is being output. The device is capable of removing the burst noise even in a one-time data, without the need of a large amount of memory.

8 Claims, 3 Drawing Sheets

BURST NOISE CANCELING APPARATUS

CROSS REFERENCE TO RELATED APPLICATIONS

This application claims the benefit of Japanese Application No. 2005-278992 filed Sep. 27, 2005.

BACKGROUND OF THE INVENTION

The present invention relates to a burst noise canceling apparatus, and more specifically to a burst noise canceling apparatus, which is able to remove any burst noise in one-time-only data, and does not require a large amount of memory.

Conventionally, there is known a waveform display apparatus, which stores in its memory many previous waveform data items for the number of triggers, to select the median data item from a plurality of waveform data items of the same time in order to display (c.f., Patent Reference 1).

[Patent Reference 1] JP-A-2003-98193

The waveform display apparatus as described above removes the burst noise by selecting the median data item from a plurality of waveform data items of the same time.

However, if the number of triggers is only one, the apparatus cannot remove the burst noise. Also it requires a large amount of memory.

SUMMARY OF THE INVENTION

Therefore, an object of the present invention is to provide a burst noise canceling apparatus, which is capable of canceling a burst noise even in one-time-only data, and which does not require a large amount of memory.

In a first aspect, the present invention provides a burst noise canceling apparatus, which includes: an analog-to-digital converter means for sampling analog signals, and converting them to digital values to output them; a digital value delay output means for delaying the digital values by delay time L to output them; a burst noise detector means for outputting detection pulses upon detecting burst noises mixed in the analog signals; a noise canceling means for starting a canceling operation of the output of the digital value delay output means after the removal start time L−B has elapsed based on the detection pulse generated when a removal operation of the output from the digital value delay output means is not in action, for terminating the canceling operation after the removal termination time L+A has elapsed based on the detection pulse if there is not another new detection pulse generated after the onset of the detection pulse until the removal operation is finished, and for prolonging the removal operation if the new detection pulse is generated so as to terminate the removal operation after the removal termination time L+A has elapsed based on the new detection pulse.

The burst noise canceling apparatus according to the first aspect described above, can remove data from the moment "L−B" before the burst noise to the moment "L+A" after the burst noise, if there is only one burst of noise. If there are two or more bursts of noise, it can remove data from the moment "L−B" before the occurrence of the first burst to the moment "L+A" after the occurrence of the last burst. The device is also capable of eliminate the burst noise even in one-time data, and does not need a large amount of memory.

In a second aspect, the present invention provides a burst noise canceling apparatus according to the first aspect of the present invention, wherein the digital value delay output means is a FIFO.

The burst noise canceling apparatus according to the second aspect described above, may use a FIFO (First-In, First-Out) for output to delay the digital values by a delay time L.

In a third aspect, the present invention provides a burst noise canceling apparatus according to the first or second aspect, wherein the burst noise detection means is a means outputting a detection pulse having a pulse width from the moment where the amplitude of the analog signal exceeds the threshold to the moment where the signal falls below the threshold.

The burst noise canceling apparatus according to the third aspect described above, is capable of detecting a burst noise by using a simple circuit or process for comparing the amplitude of analog signal with a threshold.

In a fourth aspect, the present invention provides a burst noise canceling apparatus according to any one of the first to fifth aspects, the noise canceling means comprises a removal instruction signal output means, which starts outputting a removal instruction signal after the removal start time L−B has elapsed based on the detection pulse generated when the removal operation of the output from the digital value delay output means is not in action, terminates outputting the removal instruction signal after the removal termination time L+A has elapsed based on the detection pulse if there is not another detection pulse generated from the moment where the detection pulse has been generated until the moment where the output of the removal instruction signal is over, and continues to output the removal instruction signal until the removal termination time L+A has elapsed based on the new detection pulse if the new detection pulse is generated; and a data removal means for canceling the output from the digital value delay output means while the removal instruction signal is being output.

The burst noise canceling apparatus according to the fourth aspect described above, is capable of removing data from the moment "L−B" before a burst noise to the moment "L+A" after the burst noise. If there are two or more burst noises in succession, it can eliminate data present in the range from the moment "L−B" prior to the first burst of noise to the "L+A" after the last burst of noise.

In a fifth aspect, the present invention provides a burst noise canceling apparatus according to the sixth aspect, wherein the removal instruction signal output means comprises: a shift register having a first output which becomes "1" during the period of time of the pulse width after the time L−B has elapsed from the moment where the detection pulse is read, and a second output which becomes "1" during the period of time of the pulse width after the time L+A has elapsed from the where the detection pulse is read; an up-and-down counter which will count up with the first output and count down with the second output; and an OR circuit which outputs "1" when the count value of the up-and-down counter is not "0", and the removal instruction signal output means outputs the removal instruction signal when the output from the OR circuit is "1".

The burst noise canceling apparatus according to the fifth aspect described above, uses the shift registers and the OR circuit to constitute the canceling instruction signal output means.

In a sixth aspect, the present invention provides a burst noise canceling apparatus according to the fifth aspect described above, wherein the count of the up-and-down counter goes up at the rising edge of the first output.

The burst noise canceling apparatus according to the sixth aspect described above may output canceling instruction signal without delay even when the pulse width of detected pulse is large.

In a seventh aspect, the present invention provides a burst noise canceling apparatus according to the fifth or sixth aspect described above, wherein the count of the up-and-down counter goes down at the falling edge of the second output.

The burst noise canceling apparatus according to the seventh aspect is capable of outputting canceling instruction signal until the time when the output is sufficient even if the pulse width of the detection pulse is large.

In a eighth aspect, the present invention provides a burst noise canceling apparatus according to any one of the first to seventh aspect, wherein the analog signal is an MR (Magnetic Resonance) signal received from an MRI (Magnetic Resonance Imaging) apparatus.

The burst noise canceling apparatus according to the eighth aspect as have been described above is capable of suitably canceling the burst noise in the MR signal received from an MRI apparatus.

The burst noise canceling apparatus according to the present invention is capable of canceling burst noises even in one-time-only data, without need of a large amount of memory.

The burst noise canceling apparatus according to the present invention can be served for removing the burst noise in the received MR signal from an MRI apparatus.

Further objects and advantages of the present invention will be apparent from the following description of the preferred embodiments of the invention as illustrated in the accompanying drawings.

DETAILED DESCRIPTION OF THE INVENTION

The best mode for carrying out the present invention as shown in the accompanying drawings will be described in greater details herein below. It should be understood that the embodiments disclosed herein are not to be considered to limit the invention.

First Embodiment

Figure 1:
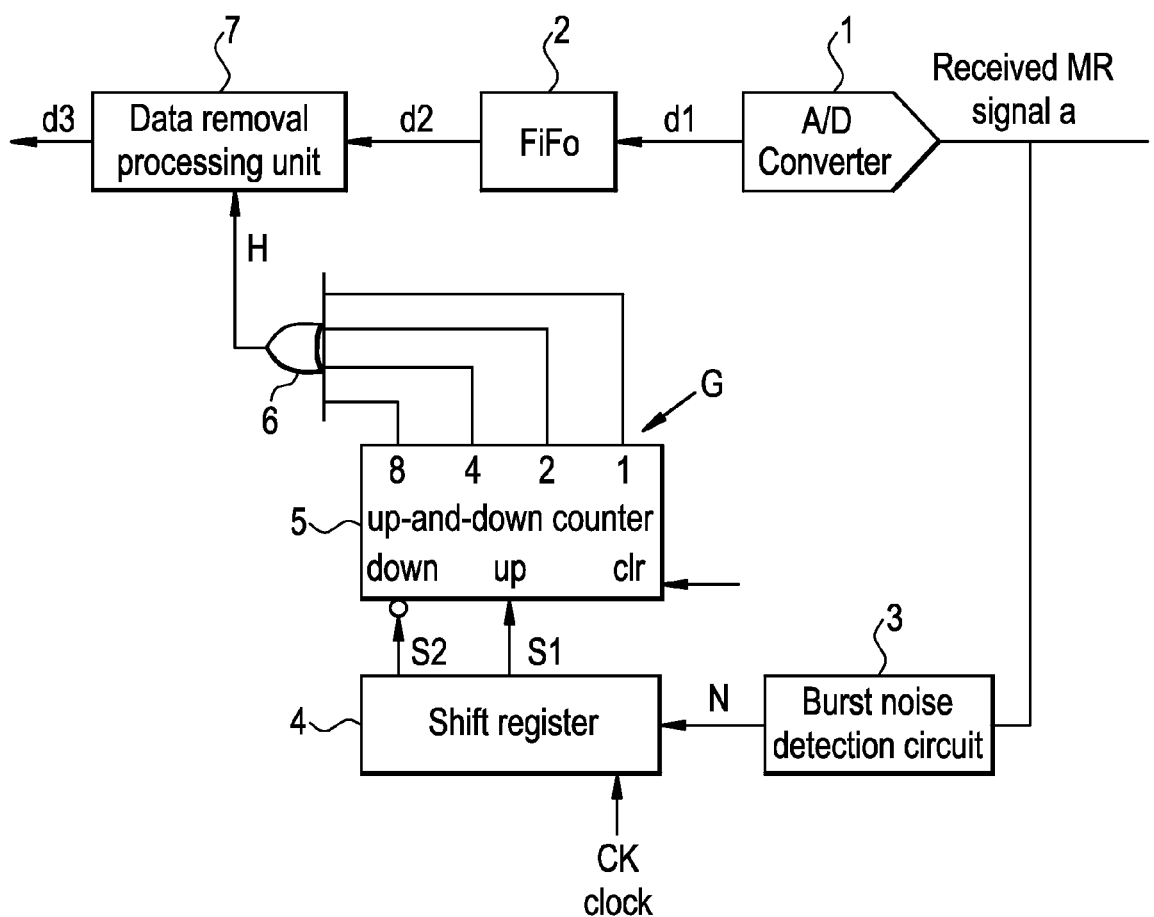
FIG. 1 is a schematic block diagram indicating the arrangement of a burst noise canceling apparatus according to the first preferred embodiment of the present invention.

FIG. 1 shows a schematic block diagram indicating a burst noise canceling apparatus 100 according to first embodiment of the present invention.

The burst noise canceling apparatus 100 includes an analog-to-digital converter 1 for sampling the MR signal a (=analog signal) received from an MRI apparatus, converting it to digital value d1 to output, a FIFO 2 for delaying the digital value d1 by the delay time L for output, a burst noise detection circuit 3 for outputting a detection pulse N when detecting the presence of a burst noise (n1 in FIG. 2) in the received MR signal a, a shift register 4 having a first output S1 which goes to "1" for the duration of the pulse width of the detected pulse N after the time L−B has elapsed since reading the detection pulse N, and a second output S2 which goes to "1" for the duration of the pulse width of the detected pulse N after the time L+A has elapsed since reading the detection pulse N, an up-and-down counter 5 for counting up at the rising edge of the first output S1 and counting down at the falling edge of the second output S2, an OR circuit 6 for outputting "1" when the count G of the up-and-down counter 5 is not "0" as the removal instruction signal H, and a data removal processing unit 7 which forces the output of the FIFO 2 to "0" when the removal instruction signal H is on the output.

Figure 2:
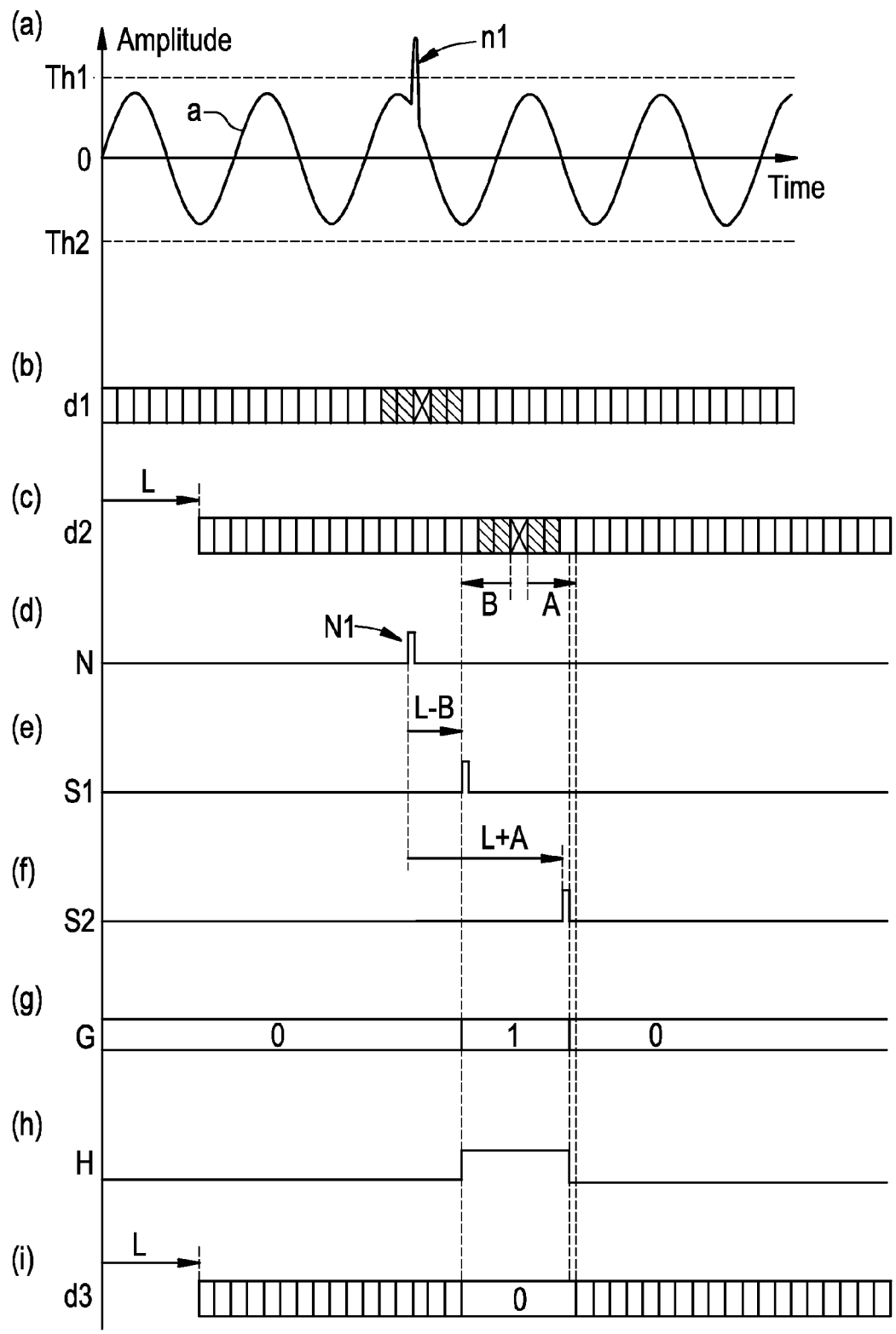
FIG. 2 is a time chart indicating miscellaneous signals when only one single burst noise is arrived.

FIG. 2 shows a time chart indicating miscellaneous signals in case of one single burst noise.

As shown in (a), the received MR signal a is sinusoidal wave, the amplitude of which is fallen between a threshold Th1 and another threshold Th2. Assuming that when the burst noise n1 is applied thereon the amplitude exceeds the threshold Th1 or the threshold Th2.

As shown in (b), the digital value d1 is a digital value that samples the received MR signal a. The digital value when the burst noise n1 is applied (marked as X) indicates the data to be removed. The digital values immediately before and after it (marked as slash), which are likely to be less reliable, are also good candidate to the removal.

As shown in (c), the digital value d2 is the signal that the digital value d1 is delayed by the delay time L.

As shown in (d), the detection pulse N1 is a pulse signal having a pulse width corresponding to the span that the amplitude of received MR signal a goes beyond the thresholds Th1, Th2 and fallen back below the threshold Th1, Th2.

The shift register 4 will shift by reading the detection pulse N1 by the clock CK having a sufficiently smaller cycling period τ than the pulse width of the Detection Pulse N1. For example, in the case of delay time L=6 μs, B=3 μs, A=3 μs, then the cycle τ=1 μs, and the number of bits in the shift register 4 will be 10 bits, with the fourth bit being on the first output S1, and the tenth bit being on the second output S2. By this, as shown in (e), the first output S1 will become "1" for the duration of the detection pulse N1 after 3 μs (=L−B) since the detection pulse N1 has been read. In addition, as shown in (f), the second output S2 will become "1" for the duration of the pulse width of the detection pulse N1 9 μs (=L+A) after the detection pulse N1 is read.

As shown in (g), the count G of the up-and-down counter 5 is initialized to "0", and it will count up by the first output S1 and down by the second output S2.

As shown in (h), the removal instruction signal H will become "1" when the count G of the up-and-down counter 5 is not "0".

The data removal processing unit 7 passes the output d2 of the FIFO 2 to the output d3 when the removal instruction signal H is "0", and turns the output d3 to "0" when the removal instruction signal H is "1".

Figure 3:
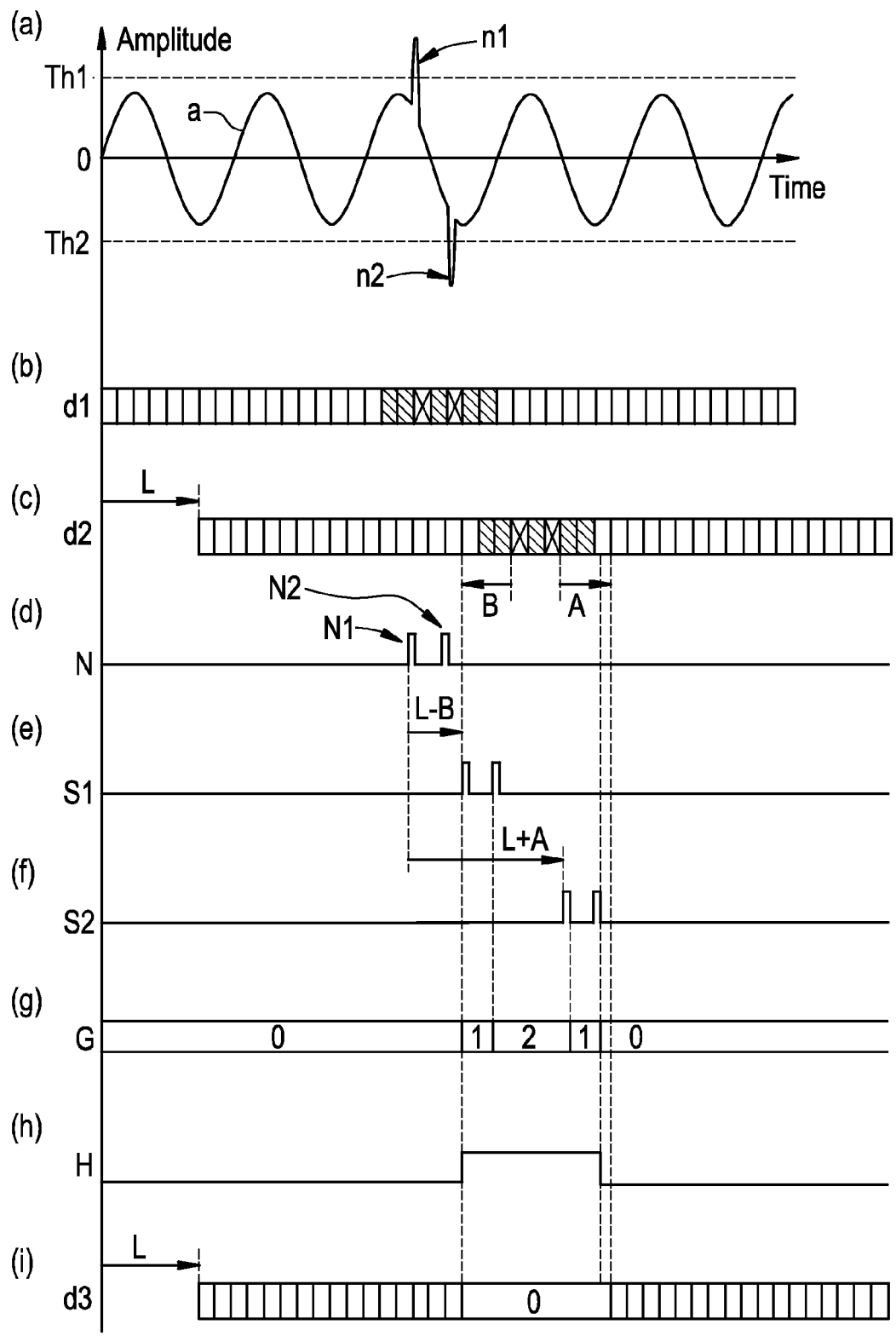
FIG. 3 is a time chart indicating miscellaneous signals when two successive burst noises are arrived.

FIG. 3 shows a time chart indicating miscellaneous signals when successive two burst noises are arrived.

As shown in (a), when the burst noise n1 and the burst noise n2 are applied, the amplitude of received MR signal a will exceed beyond the threshold Th1 or the threshold Th2.

As shown in (b), the digital value d1 is a digital value resulting from sampling the received MR signal a. The digital value (marked as X) when the burst noises n1 and n2 are applied may be data that should be removed. The digital values immediately before and after the noises (marked as slash), which are likely to be less reliable, are also data to be removed.

As shown in (c), the digital value d2 is a value delayed by the delay time L of the digital value d1.

As shown in (d), the detection pulses N1 and N2 are pulse signals that have pulse width corresponding to the interval that the amplitude of the received MR signal a exceeds beyond the thresholds Th1, Th2 and falls back below the thresholds Th1, Th2.

As shown in (e), the first output S1 will be turned to "1" for the time corresponding to the pulse width of the detection pulse N1 and the detection pulse N2 after 3 μs (=L−B) since the detection pulse N1 and the detection pulse N2 are read.

As shown in (f), the second output S2 will be turned to "1" for the time corresponding to the pulse width of the detection pulse N1 and the detection pulse N2 after 9 μs (=L+A) since the detection pulse N1 and the detection pulse N2 are read.

As shown in (g), the count G of the up-and-down counter 5 is initialized to "0", and will count up with the first output S1 and count down with the second output S2.

As shown in (h), the removal instruction signal H will be "1" when the count G of the up-and-down counter 5 is not "0".

The data removal processing unit 7 will pass the output d2 to the output d3 during the period in which the removal instruction signal H is "0", and force the output d3 to "0" when the removal instruction signal H is "1".

The burst noise canceling apparatus 100 according to the first preferred embodiment is capable of canceling burst noises even in one-time-only data. The device does not need a large amount of memory. In addition, it can cancel the burst noise correctly even when the burst noises are successively arrived.

Many widely different embodiments of the invention may be configured without departing from the spirit and the scope of the present invention. It should be understood that the present invention is not limited to the specific embodiments described in the specification, except as defined in the appended claims.

The invention claimed is:

1. A burst noise canceling apparatus, comprising:
    an analog-to-digital converter device configured to sample an analog signal and convert the analog signal to a plurality of digital values;
    a digital value delay output device configured to delay output of the plurality of digital values by a delay time and output a plurality of delayed digital values;
    a burst noise detector device configured to detect burst noise within the analog signal and output at least one detection pulse in response to the detection;
    a noise canceling device configured to:
        detect whether a removal operation is in progress, the removal operation used to remove digital values representative of the burst noise within the plurality of delayed digital values;
        initiate a canceling operation of the output of said digital value delay output device after a removal start time has elapsed from a time when a first detection pulse is generated and when the removal operation is not in progress;
        terminate the canceling operation after a removal termination time has elapsed from the time when the first detection pulse is generated if said burst noise detector device does not generate a second detection pulse after the first detection pulse and before the removal operation is finished; and
        prolong the removal operation if said burst noise detector device generates the second detection pulse and terminate the removal operation after the removal termination time has elapsed from a time when the second detection pulse is generated.

2. The burst noise canceling apparatus according to claim 1, wherein said digital value delay output device comprises a first-in, first-out (FIFO) device.

3. The burst noise canceling apparatus according to claim 1, wherein said burst noise detection device is configured to generate the at least one detection pulse with a pulse width from a moment where an amplitude of the analog signal exceeds a threshold to a moment where the amplitude of the analog signal falls below the threshold.

4. The burst noise canceling apparatus according to claim 3, wherein said noise canceling device comprises:
    a removal instruction signal output device configured to:
        initiate output of a removal instruction signal after the removal start time has elapsed from the time when a first detection pulse is generated and when the removal operation is not in progress;
        terminate output of the removal instruction signal after the removal termination time has elapsed from the time when the first detection pulse is generated if said burst noise detector device does not generate the second detection pulse between a moment when the first detection pulse is been generated and a moment when the output of the removal instruction signal is complete; and
        continue output of the removal instruction signal until the removal termination time has elapsed from the time when the second detection pulse is generated; and
    a data removal device configured to cancel the output from said digital value delay output device while the removal instruction signal is output by said removal instruction signal output device.

5. The burst noise canceling apparatus according to claim 4, wherein said removal instruction signal output device comprises:
    a shift register having a first output which becomes "1" during a period of time of the pulse width after the removal start time has elapsed from a moment where the first detection pulse is read, and a second output which becomes "1" during the period of time of the pulse width after the removal termination time has elapsed from the moment where the first detection pulse is read;
    an up-and-down counter configured to count up based on the first output and to count down based on the second output; and
    an OR circuit configured to output "1" when the count value of said up-and-down counter is not "0", wherein said removal instruction signal output device is configured to output the removal instruction signal when the output from said OR circuit is "1".

6. The burst noise canceling apparatus according to claim 5, wherein the count of said up-and-down counter goes up at a rising edge of the first output.

7. The burst noise canceling apparatus according to claim 5, wherein the count of said up-and-down counter goes down at a falling edge of the second output.

8. The burst noise canceling apparatus according to claim 1, wherein said analog signal is a magnetic resonance (MR) signal received from a magnetic resonance imaging (MRI) apparatus.

* * * * *